(12) United States Patent
Tsironis

(10) Patent No.: US 11,002,762 B1
(45) Date of Patent: May 11, 2021

(54) MILLIMETERWAVE TUNERS WITH EXTERNAL AIRLINE

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 368 days.

(21) Appl. No.: 16/111,391

(22) Filed: Aug. 24, 2018

Related U.S. Application Data

(60) Provisional application No. 62/550,336, filed on Aug. 25, 2017.

(51) Int. Cl.
| | |
|---|---|
| G01R 1/067 | (2006.01) |
| G01R 31/26 | (2020.01) |
| G01R 27/06 | (2006.01) |
| G01R 31/28 | (2006.01) |

(52) U.S. Cl.
CPC ......... *G01R 1/06772* (2013.01); *G01R 27/06* (2013.01); *G01R 31/2601* (2013.01); *G01R 31/2831* (2013.01)

(58) Field of Classification Search
CPC . G01R 1/06772; G01R 27/06; G01R 31/2601
See application file for complete search history.

(56) References Cited

U.S. PATENT DOCUMENTS

| | | | |
|---|---|---|---|
| 6,674,293 B1 | 1/2004 | Tsironis | |
| 6,998,836 B2* | 2/2006 | Tsironis | G01R 1/06772 324/149 |
| 2003/0107363 A1* | 6/2003 | Tsironis | G01R 31/2822 324/95 |

OTHER PUBLICATIONS

Load Pull, online, Wikipedia [Retrieved on Aug. 24, 2017]. Retrieved from Internet <URL: http://en.wikipedia.org/wiki/Load_pull>.
"Computer Controlled Microwave Tuner, CCMT", Product Note 41, Focus Microwaves Inc., Jan. 1998, pp. 2-4.
"Standing wave ratio" [online], Wikipedia, [Retrieved on Feb. 3, 2017]. Retrieved from Internet <URL: https://en.wikipedia.org/wiki/Standing_wave_ratio>.
"MPT, a universal Multi-Purpose Tuner", Product Note 79, Focus Microwaves Inc., Oct. 2004.

* cited by examiner

*Primary Examiner* — Noam Reisner

(57) ABSTRACT

A passive slide screw load pull tuner structure can be used on-wafer, in millimeter-wave frequencies from 20 to 110 GHz. It uses a short external (not extended) slabline, mounted sloped and allowing direct contact with the wafer probe, thus permitting the tuning probe to come as close to the wafer probe as physically possible; this minimizes the insertion loss between tuner and DUT and, thus, generates the maximum possible tuning range of a passive electromechanical impedance tuner.

6 Claims, 10 Drawing Sheets

MILLIMETERWAVE TUNERS WITH EXTERNAL AIRLINE

PRIORITY CLAIM

This application claims priority on provisional application No. 62/550,336, filed on Aug. 25, 2017, titled: "MILLIMETERWAVE TUNERS WITH EXTERNAL AIRLINE".

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. "Standing wave ratio" [online], Wikipedia, [Retrieved on 2017 Feb. 3]. Retrieved from Internet <URL: https://en.wikipedia.org/wiki/Standing_wave_ratio>.
4. Tsironis, U.S. Pat. No. 6,674,293, "Adaptable pre-matched tuner system and method".
5. "MPT, a universal Multi-Purpose Tuner", Product Note 79, Focus Microwaves Inc., October 2004.

BACKGROUND OF THE INVENTION

This invention relates to millimeter-wave load and source pull testing of medium and high power transistors and amplifiers using remotely controlled electro-mechanical impedance tuners.

Modern design of high power millimeter-wave (mm-wave) amplifiers and mixers, used in various communication systems, requires accurate knowledge of the active device's (mm-wave transistor's) characteristics. In such circuits, it is insufficient for the transistors, which operate in their highly non-linear regime, close to power saturation, to be described using non-linear numeric models only.

A popular method for testing and characterizing such microwave and millimeter-wave transistors in the non-linear region of operation is "load pull" (FIG. 1). Load pull is a measurement technique employing impedance tuners (2, 4) and other test equipment, such as signal sources (1), test fixtures (3) holding the DUT and power meters (5), the whole controlled by a computer (6); said computer controlling and communicating with said tuners (2, 4) and the other equipment (1, 5) using digital cables (7, 8, 9). The tuners are used in order to manipulate the microwave impedance conditions under which the Device Under Test (DUT, or transistor) is tested (see ref. 1); tuners allow determining the optimum impedance conditions for designing amplifiers and other microwave components for specific performance targets, such as gain, efficiency, inter-modulation etc.; this document refers hence to "tuners" as being "impedance tuners", in order to separate from "tuned receivers (radios)", popularly called elsewhere also "tuners" because of the included tuning circuits (see ref. 2). Insertion loss between the DUT and the tuners (10, 11) reduce the tuning range of the tuners (FIG. 3). It is a general aim in the technology to minimize this insertion loss (10, 11). This can be done by approaching physically the tuning core of the tuner (i.e. the tuning probe (slug), item (22) in FIG. 2)) to the DUT, which is connected at the test port (25).

Impedance tuners, FIG. 2, comprise in general a transmission line (24) with a center conductor (23) and, one or more (see ref. 4) adjustable probes (22); the probe (slug) (22) is attached to a precision vertical axis (21) which is mounted in a mobile carriage (28); the axis (21) can move the probe (22) vertically (216) in Y direction, starting at the top towards the center conductor (23) and the carriage (28) can move the probe (22) horizontally (in X direction) either towards or away (217) from the test port (25) and the DUT parallel to the center conductor (23). The vertical movement (216) changes the amplitude of the reflection factor, seen at the tuner test port (25), whereas the horizontal movement (217) changes its phase. This way the whole Smith chart is covered allowing quasi-infinite impedances from Zmin to Zmax to be synthesized at any given frequency within the "tuning range" of the tuner. Typical values of impedances created by state of the art tuners are |Zmin|=2 Ohm and |Zmax|=1250 Ohm; this corresponds to a Voltage Standing Wave Ratio (VSWR) of 25:1. The relation between reflection factor and impedance is given by GAMMA=|GAMMA|*exp(jΦ)=(Z−Zo)/(Z+Zo) {eq.1}, wherein Z is the complex impedance Z=R+jX and Zo is the characteristic impedance. |GAMMA| varies between 0 and 1; a typical value used for Zo is 50 Ohms (see ref. 3). The higher |GAMMA| the higher the "tuning range" (32) or (33), see FIG. 3. The equivalent quantity offering higher resolution both for low and high |GAMMA| is the Voltage Standing Wave Ratio: VSWR=(1+|GAMMA|)/(1−|GAMMA|){eq.2}, which varies between 1 and infinite.

Metallic probes (22, 41) or "slugs" are made in a cubical form (41) with a concave bottom, which allows to capture, when approaching the center conductor (43), the electric field between center conductor and ground, which is concentrated mostly in the area between the center conductor (43) and the grounded sidewalls of the slabline (44) (FIG. 4). This "field capturing" allows creating high and controllable reflection factors. The critical part is the required proximity (small gap [5]) and accuracy of both the vertical (46) and horizontal (45) probe movement, whereby changes in the vertical probe position (46) of a few micrometers affects the VSWR by a large amount. This invention discloses a passive single and multi-probe slabline based tuner structure maximizing the tuning range up to 110 GHz.

BRIEF SUMMARY OF THE INVENTION

A major issue with passive tuners is that the insertion loss shown in FIG. 1 (10, 11) and FIG. 9 between the tuner test port and the DUT reduces the tuning range (FIG. 3). Typical internal impedance of microwave power transistors is in the area of the spot (30). Whereas the tuning range (32) of the tuner itself can reach this point, after inserting the cable (FIG. 9) the tuning range is reduced (33) in which case the point (30) cannot be reached. Thus the need for minimizing insertion loss. Realistically, high power devices having internal impedance in area (31) cannot be reached at all using passive tuners. In that case active systems are needed, but this is not part of this invention. This invention discloses a new passive coaxial tuner structure, operational up to 110 GHz and reaching the maximum possible reflection factor (tuning range) of a passive tuner. This is obtained by creating an external airline (slabline) (57), FIG. 5, which is adapted (mounted at an appropriate angle) and connected directly, as an extension of the connector of the wafer probe (56). The original horizontal carriage and vertical axis movement of the tuner can remain, but are controlled using a new set of horizontal and vertical coordinates and movement algorithm, adapted to the new slabline configuration. The tuning probe(s) (53) are attached to extended angle bracket(s) (50). Tuner calibration and impedance synthesis are using the new set of coordinates.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 1:
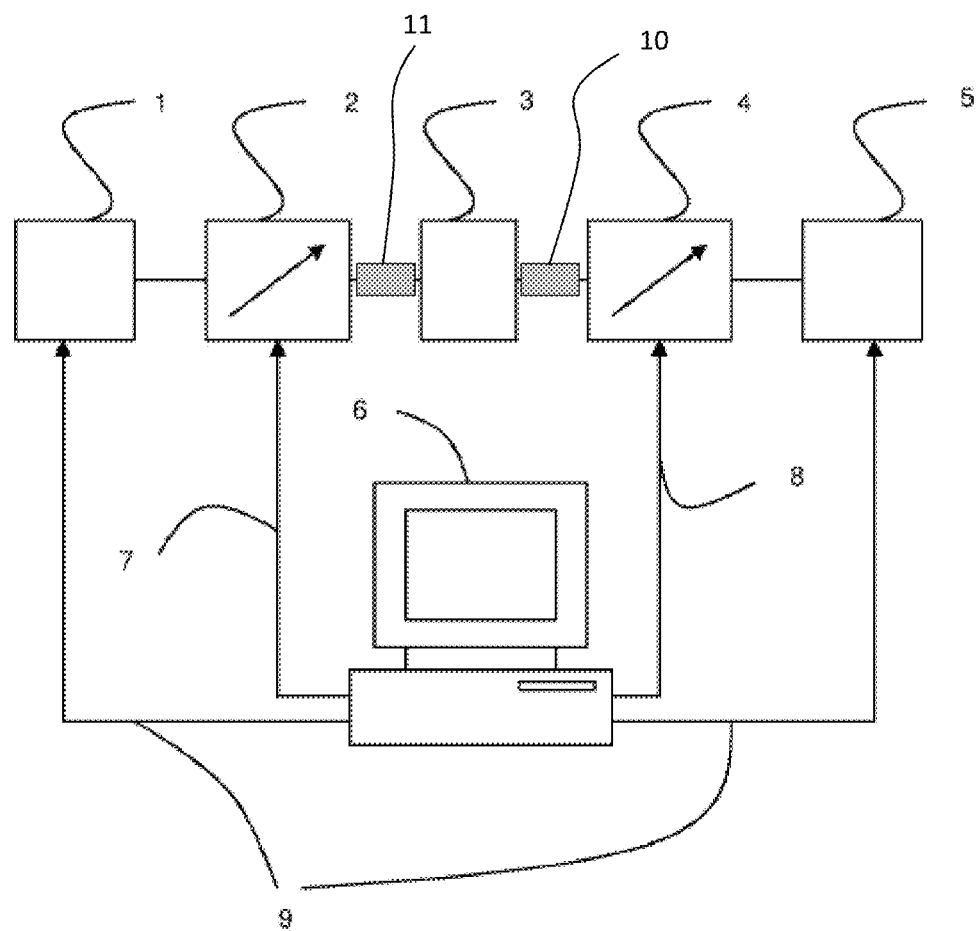
FIG. 1 depicts prior art: a typical automated transistor load pull test system.
Figure 2:
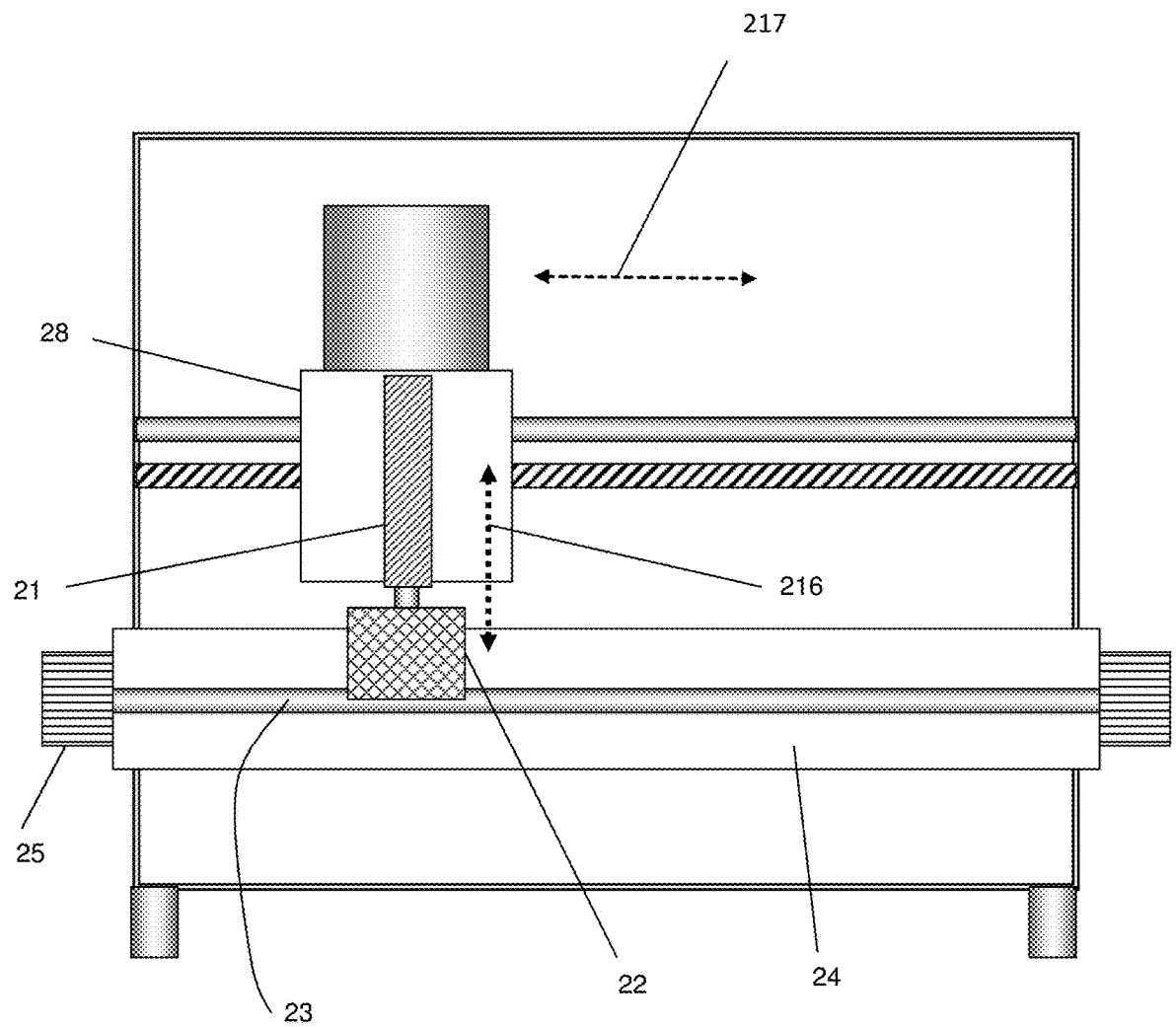
FIG. 2 depicts prior art: a front view of an automated slide screw impedance tuner using a single vertical axis and RF probe (slug).
Figure 3:
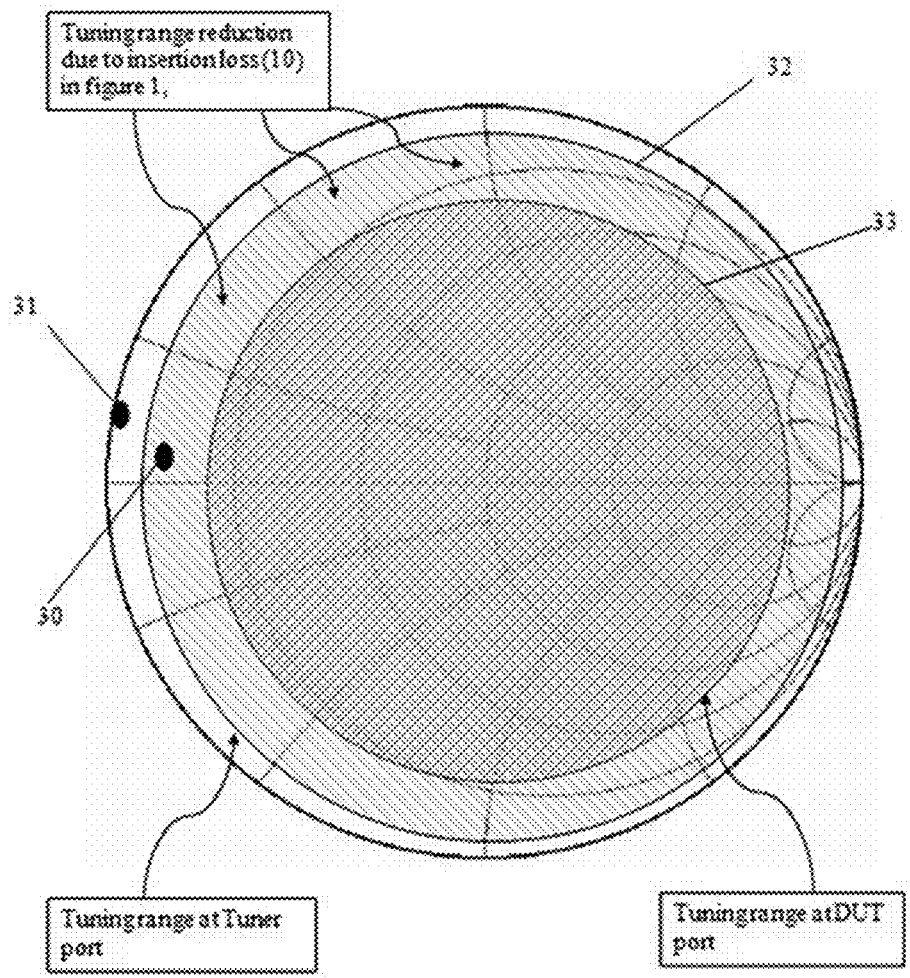
FIG. 3 depicts prior art: effect of insertion loss between tuner and DUT on tuning range and typical target impedances.
Figure 4:
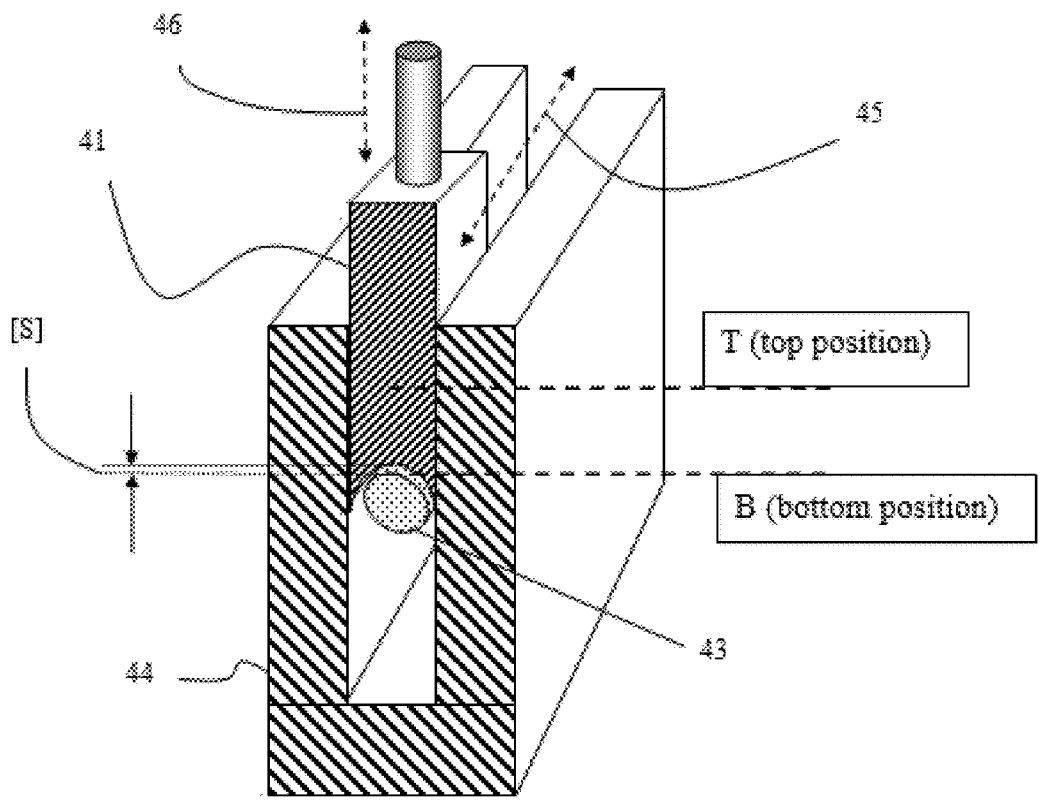
FIG. 4 depicts prior art: a perspective view and movement range of the tuning probe inside a slabline.

The new tuner structure is shown in FIG. 5 through 8. Since the tuner is designed for frequencies above 18 GHz, the horizontal travel of the tuning probe is restricted to XMAX=½*λ(18 GHz)≈8.34 mm; this means the whole horizontal remotely controlled movement can be accommodated by the sloped section of the external parallel plate airline (slabline); therefore we can use a short slabline and mount it outside the tuner body, aligned with and directly attached to the wafer probe. This eliminates two major problems: (a) the insertion loss is minimized and (b) a short slabline is easier to manufacture. But, there are two main difficulties of this configuration that require innovative solutions. The first one is to handle the effect of the rotational momentum created by the friction of the probe inside the slabline during horizontal and vertical movement, on the stability and repeatability of the carriage, which slides on the rail (508). This is being overcome by compensating spring loading of the carriage (not shown here, because it is not part of the claim, as being a known technique). The second challenge is to create a new coordination system transferring the X-Y movement of the original tuner (FIG. 5) into the new A-B movement, without allowing the tuning probe (slug) to touch the center conductor, while moving in A direction within a few micrometers from the center conductor. This requires an instantaneous decisional conversion of the motor control firmware into a new movement algorithm (FIG. 10).

The tuner comprises a solid housing (507), a mobile carriage with remotely controlled vertical motor (505) which controls the vertical axis (503) position (Y). The horizontal (X) position of the carriage is remotely controlled by acme rod (504) and associated stepper motor (506). Both horizontal and vertical movements are remotely controlled by stepper motors, gear, electronic interface and control firmware. The bracket (50) has a horizontal section and a sloped section, bent to an angle matching the axis of the coaxial connector (510) of the wafer probe (here shown to be the typical, but not exclusive, 45 degrees). The slabline (57) is short, because of the high lowest frequency of operation (typically >18 GHz). The slabline (57) is anchored permanently (59) to the body (507) of the tuner. The center conductor (58) terminates to a coaxial connector (509) which is connected to a low loss coaxial RF cable (501), which leads to the idle port (502) of the tuner.

The X-Y movement of the carriage and vertical axis are controlling the new probe coordinates A-B. Each A or B probe movement requires associated X and Y movement. i.e. while in prior art tuner's horizontal and vertical movements were independent, in the new structure they are not. In order to create independent A and B movements (i.e. parallel and perpendicular to the center conductor (58) of the sloped slabline, the carriage (505) and vertical axis (503) must move simultaneously. However, because of the slope of the center conductor, special care must be taken to avoid the slug (53) touching the center conductor, or even coming closer than the nominal proximity, since this, even if not creating a short, may generate out-of-control impedances that may create DUT oscillations. A safe transient impedance trajectory across the Smith chart always traverses closer to the center (50 Ohms).

Figure 10:
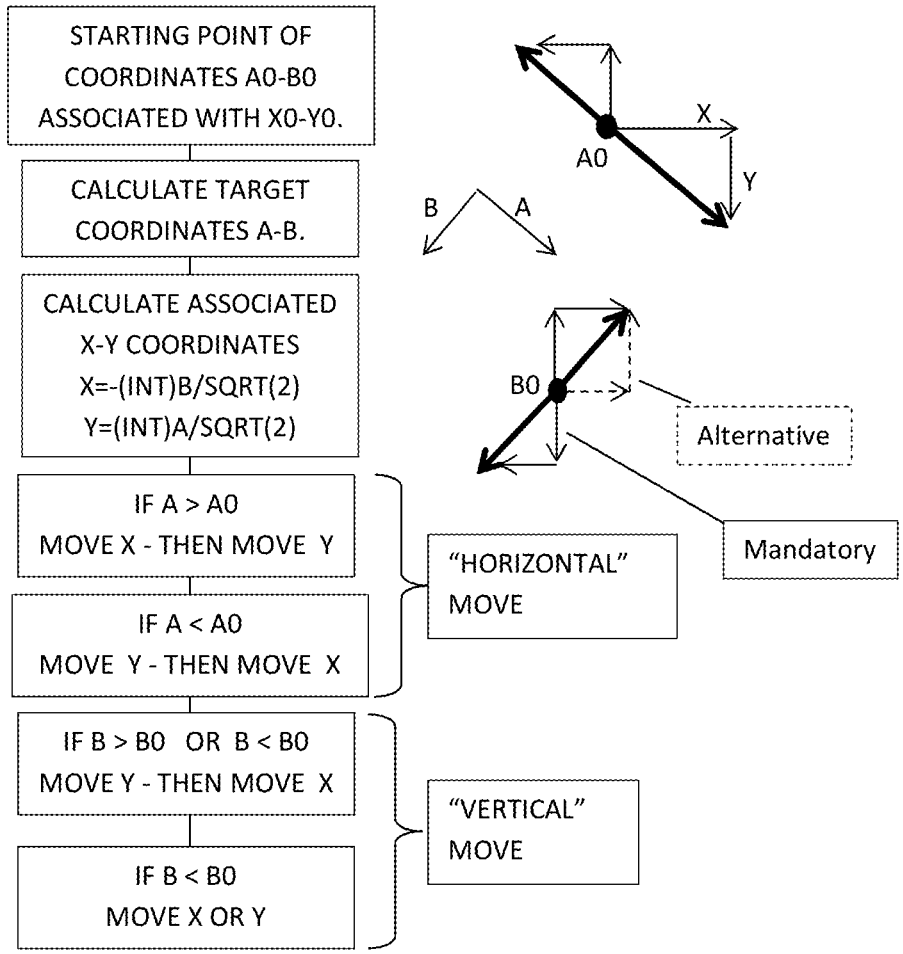
FIG. 10 depicts the probe movement flowchart.

The safe movement algorithm is shown in FIG. 10. The new coordinates are A and B. A describes the new equivalent "horizontal" movement (i.e. parallel to the center conductor of the slabline) and B the new equivalent "vertical" movement (i.e. perpendicular to the center conductor of the slabline), whereby A controls the phase and B the amplitude of the reflection factor. In both cases the sequence of the actual X and Y movements must be selected such as to avoid at least mechanical conflict, meaning the slug touching the center conductor. In the case of a (typical) 45 degree slabline slope, the coordinates X and Y of the internal tuner mechanics are: Xa=(INT)(A/sqrt(2)) and Ya=(INT)(A/sqrt(2)), Xb=(INT)(B/sqrt(2)) and Yb=(INT)(B/sqrt(2)). Hereby (INT) means an integer number, because X and Y are controlled in entire motor steps. The factor sqrt(2) stems from the fact that this example is based on typical wafer probe angle of 45 degrees. If the angle would be 30 degrees, this factor would be related to sin(30°) or cos(30°). Even a vertical wafer probe can be accommodated with this structure, though in this case A and B would simply be replaced by X and Y, whereby B=X and A=Y. Wafer probe angle is defined as the slope at which the axis of the coaxial connector exits the body of the wafer probe (FIGS. 5 and 6).

Figure 5:
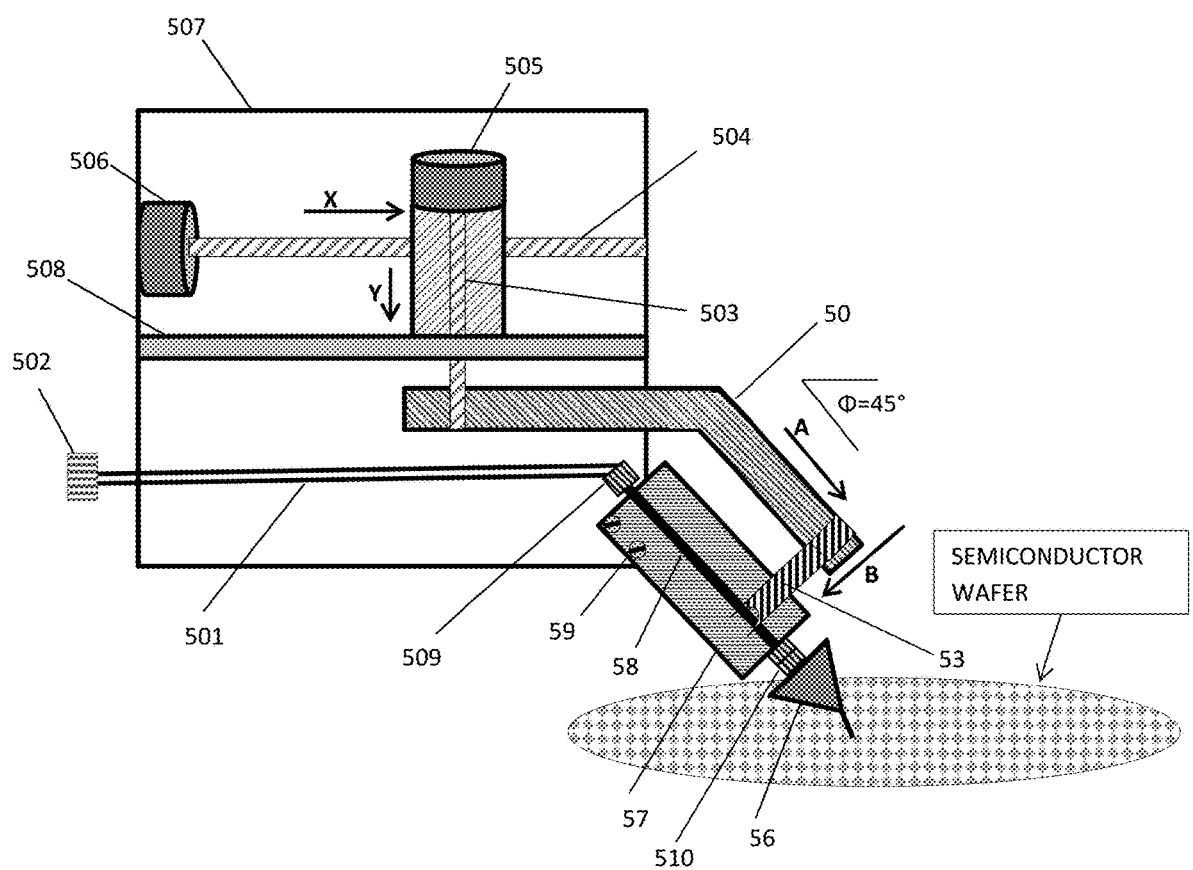
FIG. 5 depicts the overall layout of the new tuner structure with external slabline, mounted to allow load pull testing of a transistor chip on a semiconductor wafer.
Figure 6:
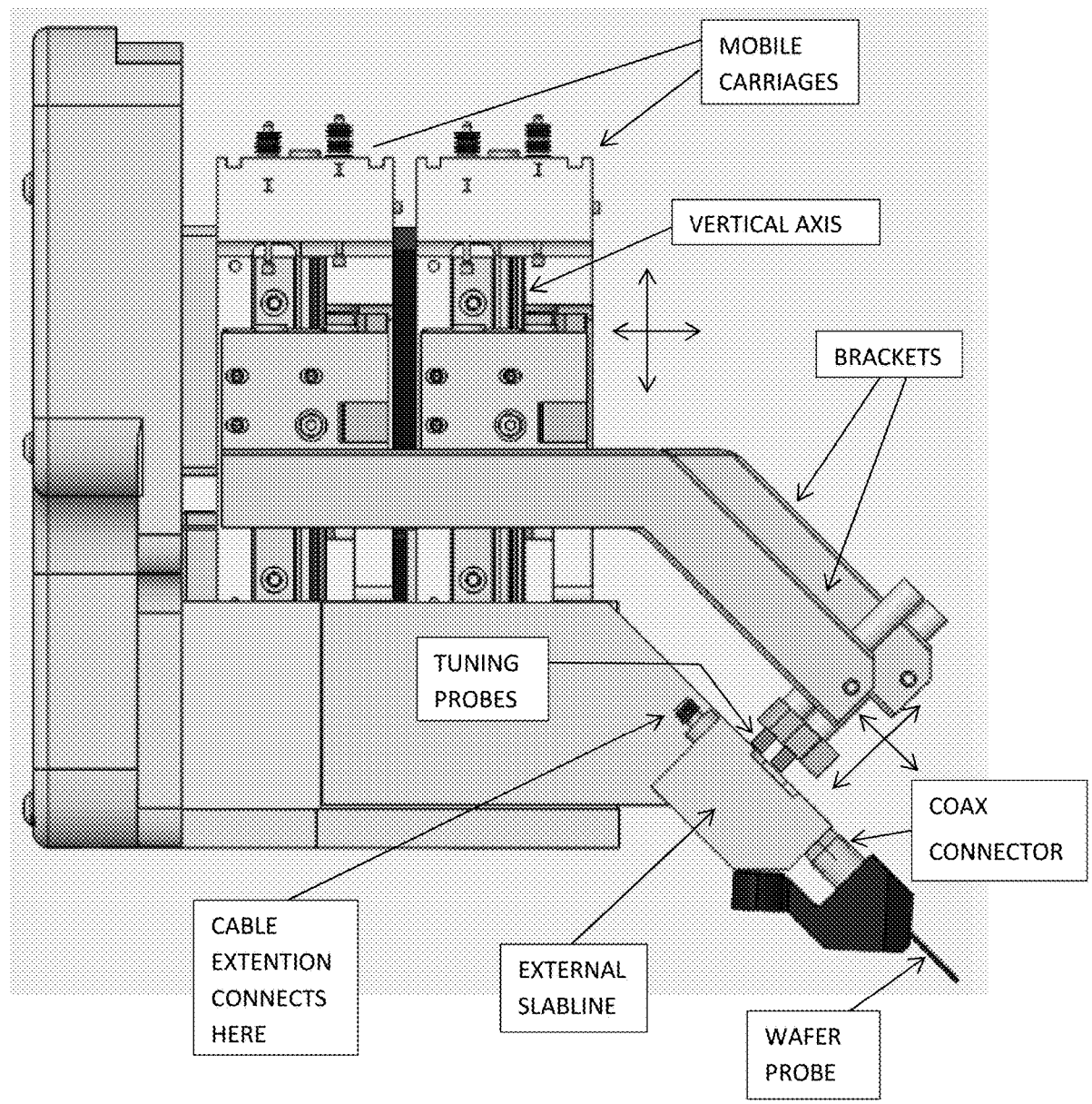
FIG. 6 depicts a front view of the new two-probe tuner structure.

As shown in FIGS. 5 and 10, if the probe (slug, 53) is to move from a starting point A0 parallel to the slabline center conductor (A-only movement), then, depending if it moves towards the wafer probe (56) (A>A0) then the sequence of the corresponding X and Y movements is: first X then Y. If the slug moves away from the wafer probe (A<A0) then first moves Y then X. In the case of slug B-only movement perpendicular to the slabline axis, from a starting point B0, then in both cases (towards and away from the center conductor) first moves Y and then X. Though moving away from the center conductor can also be executed through first moving X then Y (full and dotted arrows in case B in FIG. 10).

In general terms, because A and B determine both X and Y independently, i.e. we cannot associate one new axis with one original, instead one new axis (A or B) determine both X and Y, we must, formally, operate with two sets of X-Y axes, one caused by A (Xa, Ya) and one caused by B (Xb, Yb). The axis transformation follows the rule: increasing A and X moves the probe towards the test port and increasing B and Y moves the probe towards the center conductor, and whereby Xa=(INT)(A*cos((Φ)) and Ya=(INT)(A*sin((Φ)), and Xb=(INT)(B*sin((Φ)) and Yb=(INT)(B*cos((Φ)), whereby (F is the angle between the horizontal level and the center conductor of the slabline. If a new set of A, B is calculated, then two new sets of X,Y are determined: Xa,Ya and Xb,Yb. The probe is then moved by the algebraic sum of X and Y, i.e. X=Xa+Xb, Y=Ya+Yb, whereby Xa,Xb,Ya, Yb can be positive or negative numbers, depending on the starting positions. These operations are executed in memory, before moving the vertical axis or the carriage, using prior art tuning algorithms, which determine the target position of the probes. In the execution only the resulting X and Y count for the proper movement sequence, per flowchart of FIG. 10.

The concept of external slabline, in particular, is adapted to millimeter-wave tuners, where the required probe travel to cover 360° reflection factor on the Smith chart, i.e. half a wavelength, is short; with a minimum frequency ~20 GHz, a maximum frequency ~110 GHz, λ/2 (20 GHz)=7.5 mm and λ/2(110 GHz)=1.4 mm. Obviously more than one slug can be inserted in the slabline and operated easily, thus allowing integrating multi-carriage multi-probe harmonic tuners (see ref. 5), which use, as single probe tuners the same basic calibration and tuning algorithms, albeit employing the new set of coordinates A, B instead of the original and actually controlled, X, Y.

Figure 7:
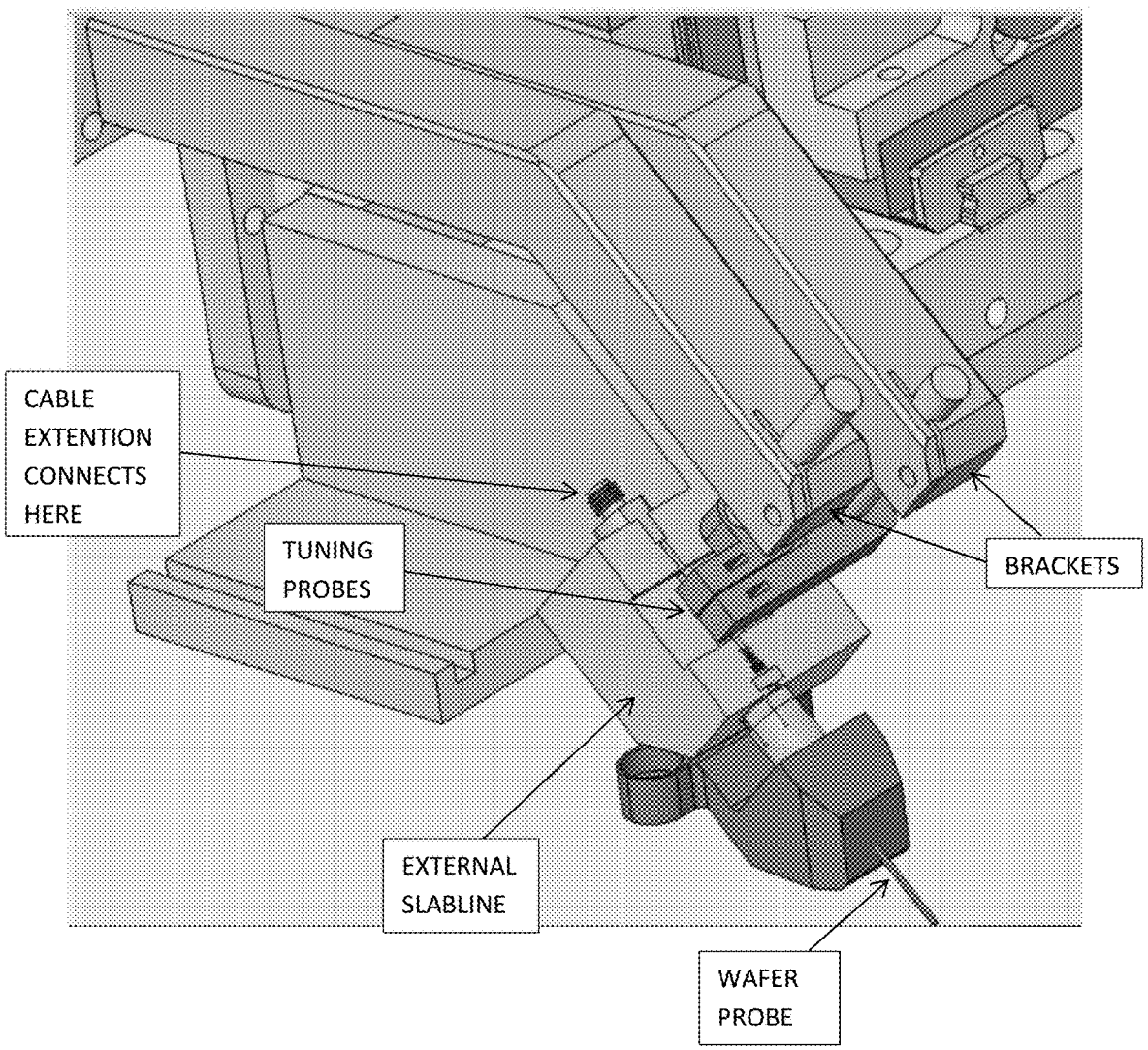
FIG. 7 depicts a detail 3D view of the new two-probe tuner structure.
Figure 8:
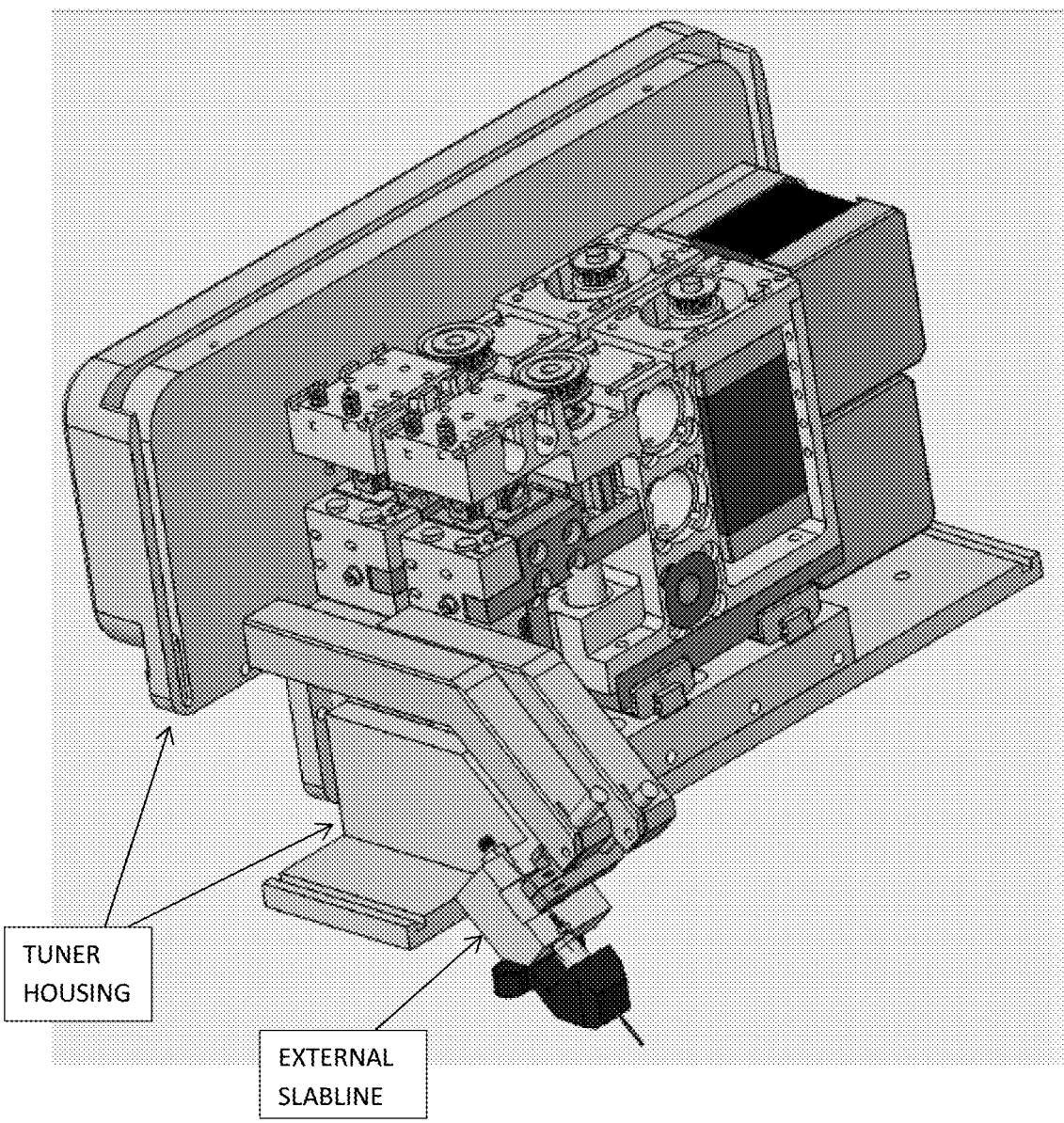
FIG. 8 depicts a 3D view of the entire tuner with two carriages, two brackets and two tuning probes.
Figure 9:
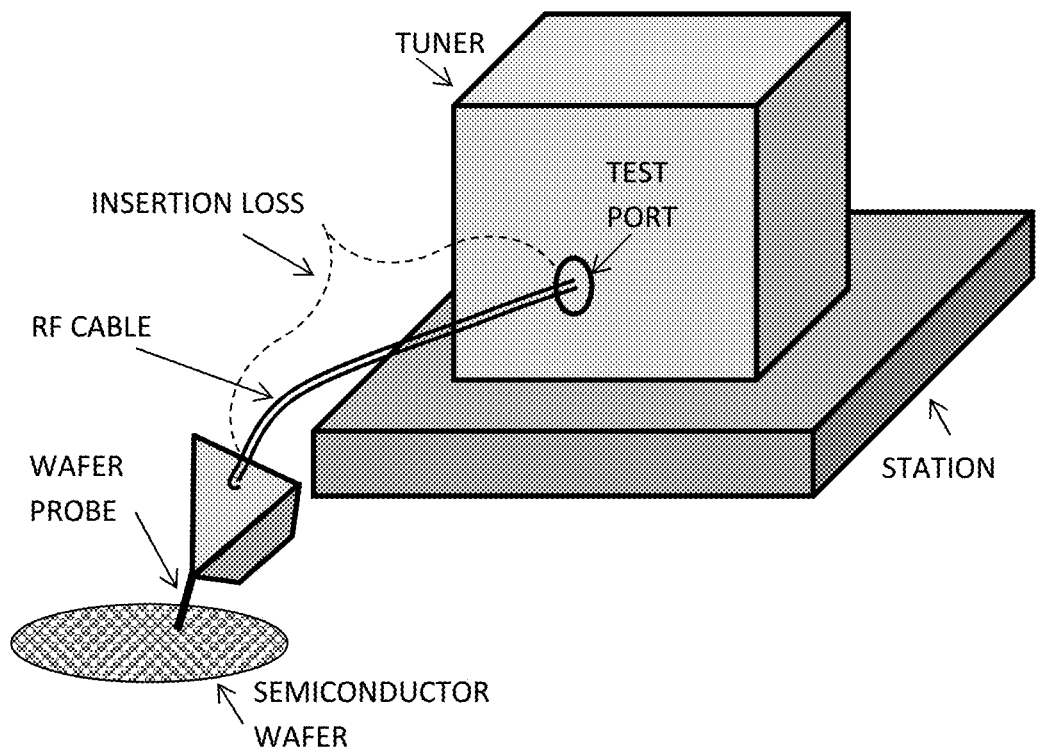
FIG. 9 depicts prior art, the origin of insertion loss in a tuner on wafer load pull setup.

Based on these definitions and movement strategies the new tuner can be handled for calibration and tuning operations similarly to prior art tuners, whereby using A and B as probe (slug) coordinates instead of originally X and Y (see. ref. 2). Such multi-carriage, multi-probe tuner configurations are shown in FIG. 6 through 8.

Obvious alternative embodiments to the herein disclosed method of maximizing the tuning range of single and multiple probe electromechanical coaxial slide screw tuners, operational in the millimeter-wave frequency range, by mounting the slabline and probe control externally to the tuner, body adjacent to the wafer probe are imaginable and possible but shall not impede on the validity of the basic idea of the present invention.

What I claim as my invention is:

1. A slide screw impedance tuner having a test port and an idle port, said tuner comprising
    a) a tuner body,
    b) at least one horizontally sliding carriage comprising a precision vertical axis,
    c) a parallel plate airline (slabline) having a center conductor, a test and an idle port, in which said slabline metallic tuning probe(s) are insertable and
    d) carriage and vertical axis remote control using stepper motors, gear, electronic interface and control firmware,
whereby the slabline is externally mounted and anchored sloped to the tuner body to match the angle of an auxiliary connected wafer probe,
and whereby the tuning probe(s) are mounted on bracket(s) having a horizontal section and a sloped section, which transpose the original horizontal-vertical movement of the carriage and vertical axis to a movement of the tuning probe, parallel and perpendicular to the center conductor of the sloped slabline.

2. The tuner of claim 1, whereby the test port of the slabline is the test port of the tuner and is connected directly to the wafer probe.

3. The tuner of claim 2, whereby the idle port of the slabline is connected to the idle port of the tuner, using a low loss transmission line.

4. The tuner of claim 3, whereby the transmission line is a RF cable.

5. A movement control algorithm for tuning probe of the tuner as in claim 1,
    whereby
        a) moving the probe towards the test port requires moving first the carriage towards the test port and then moving the vertical axis towards the center conductor, and
        b) moving the probe away from the test port requires first moving the vertical axis away from the center conductor and then moving the carriage away from the test port, and
        c) moving the probe towards or away from the center conductor requires moving the vertical axis first towards or away from the center conductor accordingly and then moving the carriage towards or away from the test port,
        d) moving the probe parallel and perpendicular to the center conductor requires moving parallel first then perpendicular.

6. A coordinate system for tuning probes of tuner as in claim 1,
    whereby
        the coordinate system comprises axes A parallel to the center conductor, and B perpendicular to the center conductor,
    and whereby
        the tuner carriage moves horizontally in X and the vertical axis in Y,
    and whereby
        increasing A and X moves the probe towards the test port and increasing B and Y moves the probe towards the center conductor,
    and whereby
        for a A movement parallel to the center conductor and a B movement perpendicular to the center conductor, new horizontal coordinates Xa and Xb and vertical coordinates Ya and Yb are $Xa=(INT)(A*cos(\Phi)), Ya=(INT)(A*sin(\Phi))$ and $Xb=(INT)(B*sin(\Phi)), Yb=(INT)(B*cos(\Phi))$, whereby
        Φ is the angle between the horizontal level and the center conductor of the slabline.

* * * * *